(12) United States Patent
Monzel

(10) Patent No.: US 6,542,434 B1
(45) Date of Patent: Apr. 1, 2003

(54) PROGRAMMABLE SELF TIME CIRCUITRY FOR MEMORIES

(75) Inventor: Carl A. Monzel, Lakeville, MN (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/871,023

(22) Filed: May 31, 2001

(51) Int. Cl.[7] ................................................. G11C 8/00
(52) U.S. Cl. ................................... 365/233; 365/230.06
(58) Field of Search ........................... 365/233, 230.06, 365/230.03, 230.01, 231

(56) References Cited

U.S. PATENT DOCUMENTS 6,075,746 A * 6/2000 Ohsawa ................. 365/189.09
6,288,930 B1 * 9/2001 Takeshima et al. ......... 365/145
6,434,074 B1 * 8/2002 Brown ....................... 365/210

* cited by examiner

*Primary Examiner*—Michael S. Lebentritt
*Assistant Examiner*—Anh Phung
(74) *Attorney, Agent, or Firm*—Suiter & Associates, PC

(57) ABSTRACT

A programmable self time circuit for controlling bit line separation in a memory includes multiple self time word lines, each of which is connected to at least one core cell of the memory for activating the cell. The self time word lines have enable signals that can either be programmed on/off, or can be externally controlled for variation of the amount of bit line separation developed during a memory access.

25 Claims, 3 Drawing Sheets

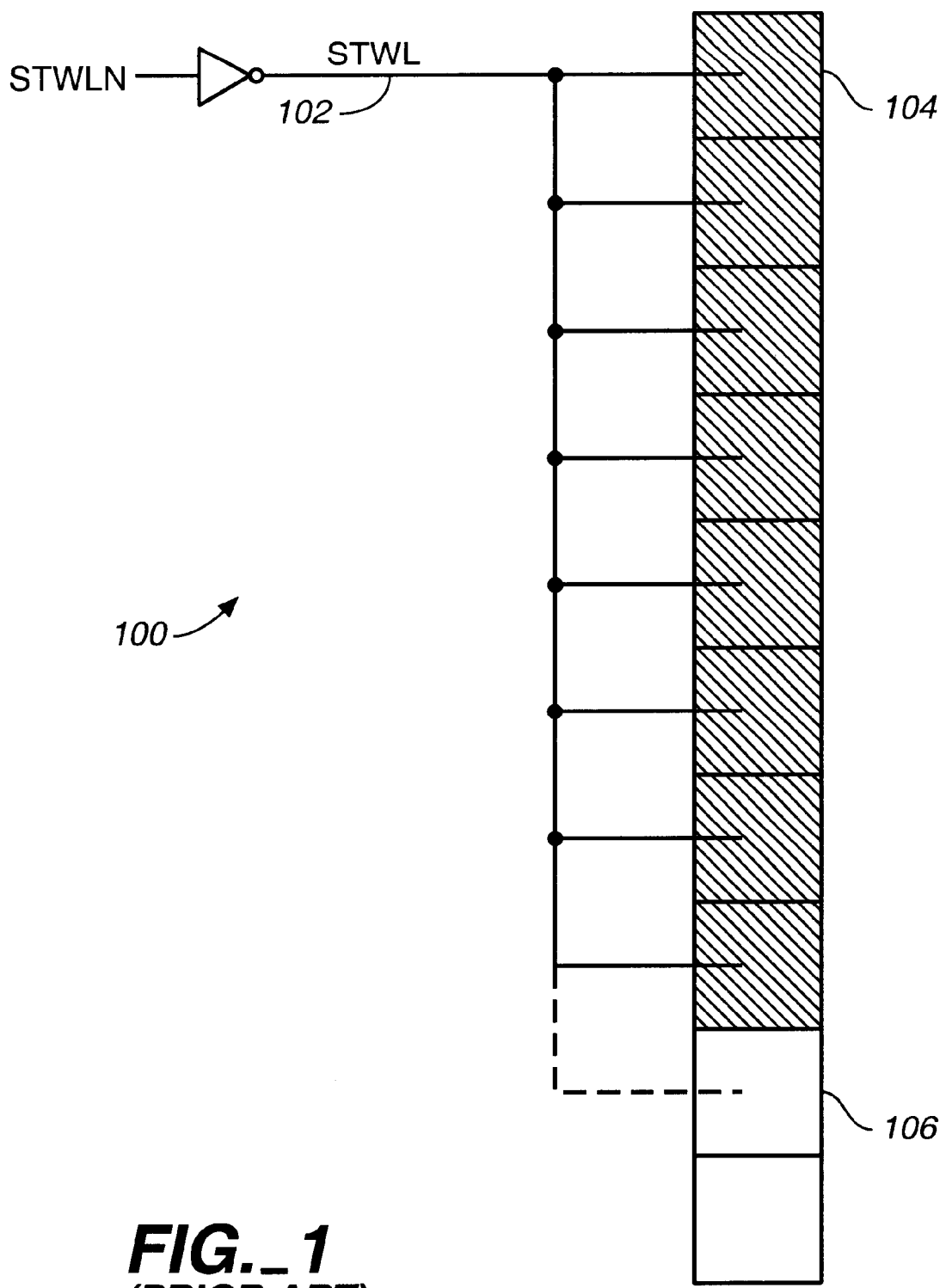
FIG._1
*(PRIOR ART)*

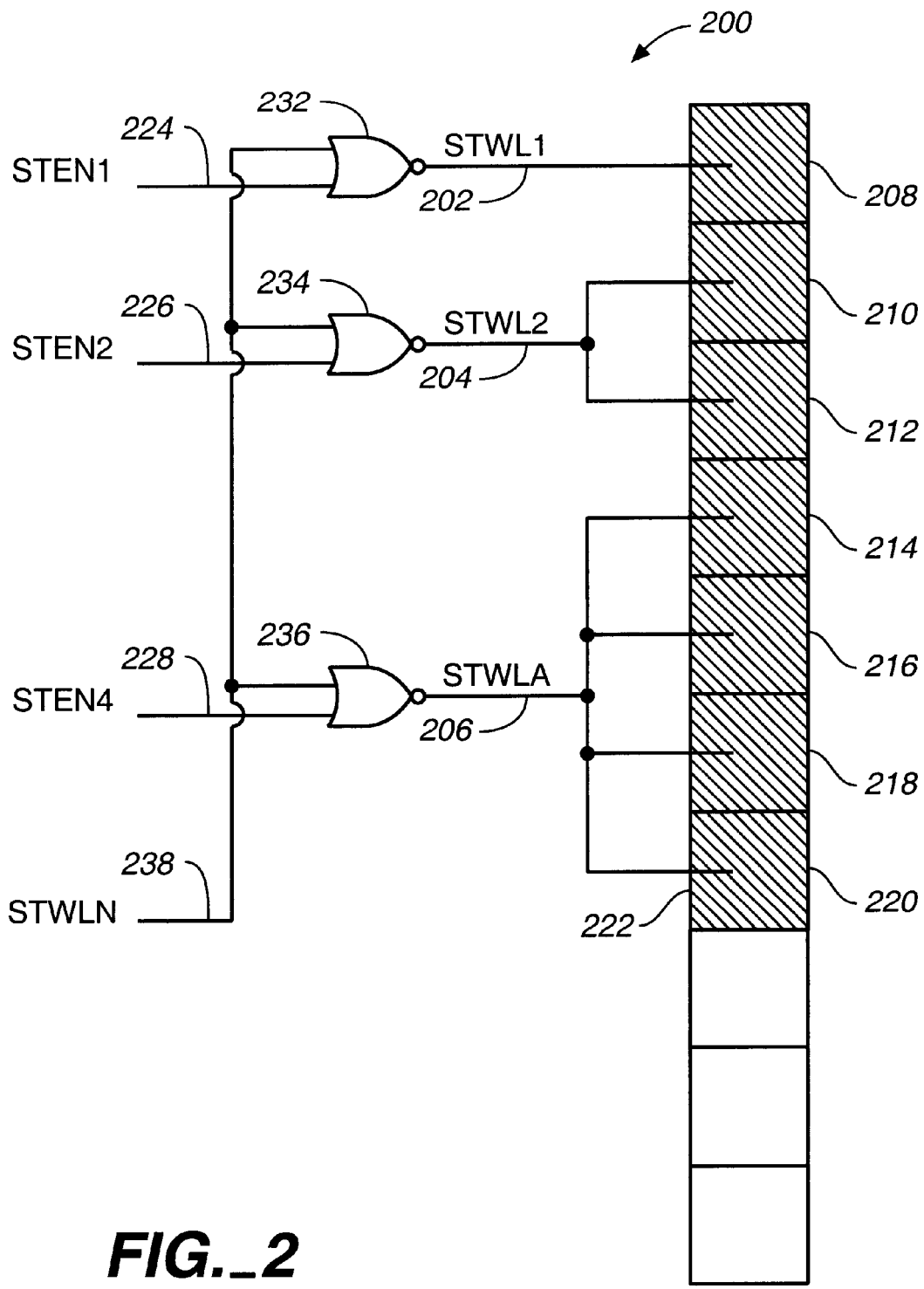
FIG._2

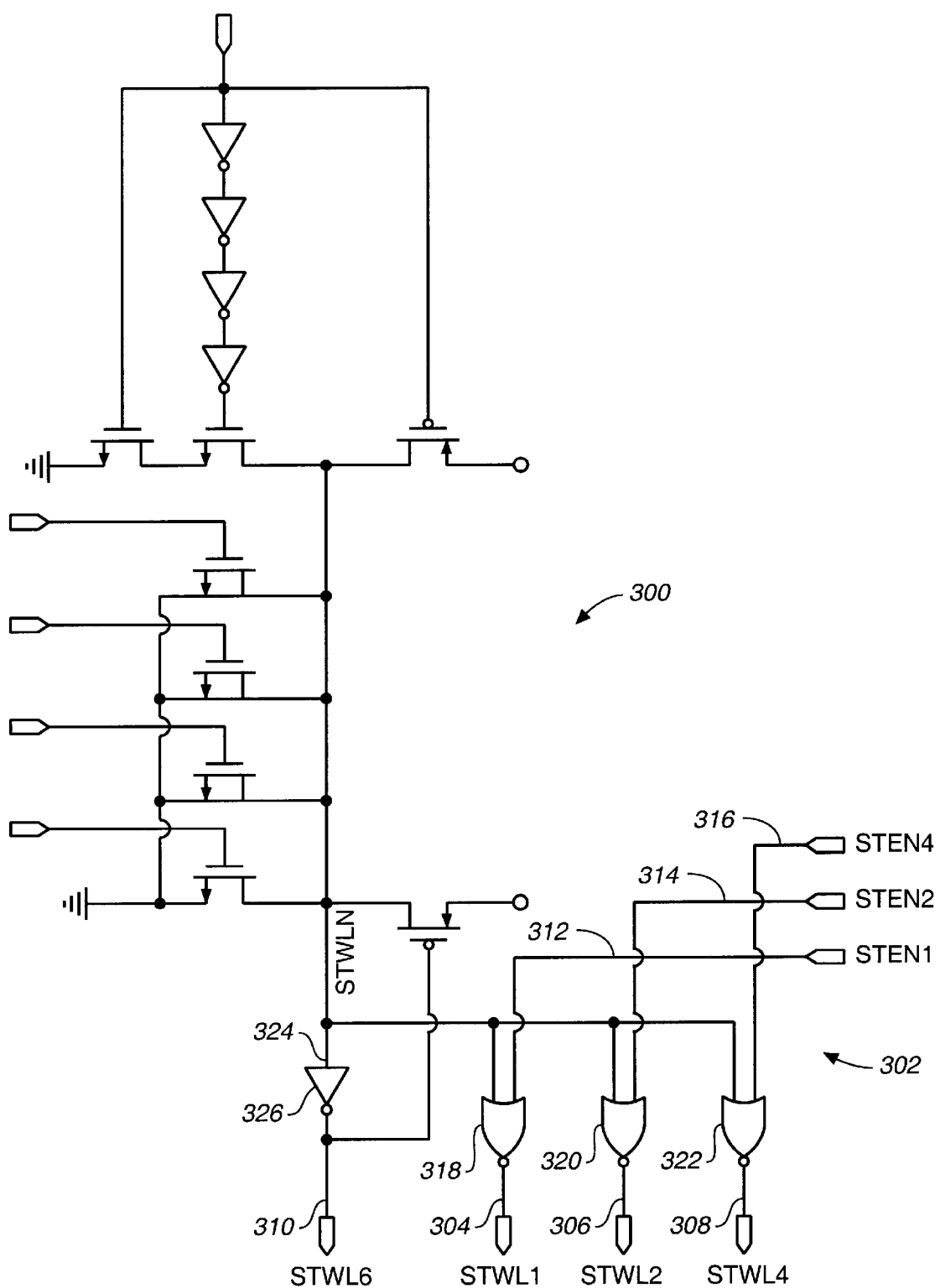
FIG._3

US 6,542,434 B1

PROGRAMMABLE SELF TIME CIRCUITRY FOR MEMORIES

FIELD OF THE INVENTION

The present invention relates generally to self time memories, and more specifically to a programmable self time circuit for controlling bit line separation in a memory during memory read access and the like.

BACKGROUND OF THE INVENTION

In self time memories, the circuitry used to control bit line separation has typically consisted of a single bank of core cells tied to a common self time word line. Thus, the bit line separation is an inverse function of the number of self time core cells connected to the self time word line (STWL), or "M-factor" of the memory. For instance, FIG. 1 illustrates a self time circuit 100 wherein the self time word line "STWL" 102 of the circuit 100 is connected to eight core cells 104. Thus, the circuit 100 illustrated would provide an M-factor of eight (8).

To modify the bit line separation, for example, to tune in a value of bit line separation that is sufficiently fast to accommodate the margin speed of the memory, the M-factor (i.e., number of core cells connected to the self-time word line) must be changed by either connecting or disconnecting core cells from the self time word line. Thus, as shown in FIG. 1, modification of the bit line separation by increasing the M-factor from eight (8) to nine (9) for the circuit 100 shown, requires that an additional core cell 106 be connected. However, connection or disconnection of core cells requires multiple mask changes making failure analysis or experimentation difficult and costly.

Consequently, it is desirable to provide a programmable self time circuit for controlling bit line separation in a memory when the memory is accessed, for example, during memory read access and the like, without the need to perform multiple masks.

SUMMARY OF THE INVENTION

Accordingly, the present invention is directed to a programmable self time circuit for controlling bit line separation in a memory when the memory is accessed, for example, during memory read access and the like. In exemplary embodiments, the self time circuit is comprised of multiple self time word lines, each of which is connected to at least one core cell of the memory for activating the cell. These self time word lines have enable signals that can either be programmed on/off, or can be externally controlled, allowing for variation of the amount of bit line separation developed during a memory access. In this manner, the number of possible bit line separations is limited only by the number of self time word lines and enables.

It is to be understood that both the foregoing general description and the following detailed description are exemplary and explanatory only and are not restrictive of the invention as claimed. The accompanying drawings, which are incorporated in and constitute a part of the specification, illustrate presently preferred embodiments of the invention, and together with the general description given above and the detailed description oft he preferred embodiments given below, serve to explain the principles of the invention.

BRIEF DESCRIPTION OF THE DRAWINGS

The detailed description of the invention may be best understood when read in reference to the accompanying drawings wherein:

FIG. 1 is a block diagram illustrating bit line separation in a memory;

FIG. 2 is a block diagram illustrating a self time circuit suitable for use in controlling bit line separation in a memory in accordance with an exemplary embodiment of the present invention; and FIG. 3 is a circuit diagram illustrating an exemplary implementation of the self time circuit shown in FIG. 2.

DETAILED DESCRIPTION OF THE INVENTION

The present invention provides a programmable self time circuit for latching sense amplifiers in a self time memory, thereby allowing for easily varying the amount of bit line separation that is developed during a memory access. Reference will now be made in detail to the presently preferred embodiment of the invention, an example of which is illustrated in the accompanying drawings.

FIG. 2 illustrates a self time circuit suitable for use in controlling bit line separation in a memory in accordance with an exemplary embodiment of the present invention. The self time circuit 200 includes multiple self time word lines 202–206 each connected to varying number of core cells 208–220 of the memory 222. In the embodiment shown, three self time word lines "STWL1" 202, "STWL2" 204, and "STWL4" 206 are provided. Self time word line "STWL1" 202 is connected to a single core cell 208, while self time word line "STWL2" 204 is connected to two core cells 210 & 212, and self time word line "STWL4" 208 is connected to four core cells 214, 216, 218 & 220, respectively. Self time word lines "STWL1" 202, "STWL2" 204, and "STWL4" 206 receive enable signals that may either be programmed on/off, or externally controlled to specific states. For instance, as shown in FIG. 2, self time circuit 200 further may further include a plurality of self time enable lines "STEN1" 224, "STEN2" 226, and "STEN4" 228, each providing one input of a NOR gate 232, 234 & 236, for which the other input is the normal common self time word line "STWLN" 238 of the memory and the output is a self time word line "STWL1" 202, "STWL2" 204, or "STWL4" 206. Thus, NOR gate 232 has inputs of self time enable line "STEN1" 224 and common self word line "STWLN" 238 and an output of self time word line "STWL1" 202, NOR gate 234 has inputs of self time enable line "STEN2" 226 and common self word line "STWLN" 238 and an output of self time word line "STWL2" 204, and NOR gate 236 has inputs of self time enable line "STEN4" 228 and common self word line "STWLN" 238 and an output of self time-word line "STWL4" 206.

The self time enable signals of self time enable lines "STEN1" 224, "STEN2" 226, and "STEN4" 228, may be either programmed or externally set to specific states before the memory 222 is accessed. In this manner, when memory 222 is accessed, the signal that would normally activate the common self time word line, provided via self time word line "STWLN" 238, is input to NOR gates 232, 234 & 236 along with the preset or preprogrammed states provided by self time enable lines "STEN1" 224, "STEN2" 226, and "STEN4" 228. Depending on the state of the self time enable signals of self time enable lines "STEN1" 224, "STEN2" 226, and "STEN4" 228, self time word lines "STWL" 202, "STWL2" 204, and "STWL4" 206 will either be asserted or not asserted. The combination of self time word lines "STWL1" 202, "STWL2" 204, and "STWL4" 206 that are asserted will activate a number of core cells 208–220 (referred to as the M-factor) which will in turn allow for a certain amount of bit line separation. It will be appreciated that the number of possible bit line separations is limited only by the number of self time word lines or self time enable lines. Thus, the range of bit line separation (the inverse of the M-factor) may be defined as follows:

$$BLS = 2^{N_{STEN}}$$

where BLS is the range of bit line separation and $N_{STEN}$ is the number of self time enable lines or signals.

Referring now to FIG. 3, an exemplary implementation of a self time circuit in accordance with the present invention is described. The memory 300 shown includes a self time circuit 302 having four self time word lines "STWL1" 304, "STWL2" 306, "STWL4" 308 and "STWL6" 310. Self time word line "STWL1" 304 is connected to a single core cell, while self time word line "STWL2" 306 is connected to two core cells, self time word line "STWL4" 308 is connected to four core cells, and self time word line "STWL6" 310 is connected to six core cells. Self time word lines "STWL1" 304, "STWL2" 306, "STWL4" 308 and "STWL6" 310 receive enable signals that may either be programmed on/off, or externally controlled to specific states. As shown in FIG. 3, self time word lines "STWL1" 304, "STWL2" 306 and "STWL4" 308 receive enable signals via self time enable lines "STEN1" 312, "STEN2" 314, and "STEN4" 316. These self time enable lines each provide one input of a respective one of NOR gates 318, 320 & 322, for which the other input is the normal common self time word line "STWLN" 324 and the outputs are self time word lines "STWL1" 304, "STWL2" 306 and "STWL4", respectively. Self time word line "STWL6" 310 receives an enable signal via "STWL N" 324 inverted by inverter 326. The self time enable signal of self time lines "STEN1" 312, "STEN2" 314, and "STEN4" 316, may be either programmed or externally set to specific states before the memory 300 is accessed. In this manner, when memory 300 is accessed, the signal that would normally activate the common self time word line, provided via self time word line "STWLN" 324, is input to NOR gates 318, 320 & 322 along with the preset or preprogrammed states provided by self time enable lines "STEN1" 314, and "STEN4" 316. The signal provided by self time word line "STWLN" is also input to inverter 326. Depending on the state of the self time enables signals of self time enable lines "STEN1" 312, "STEN2" 314, and "STEN4" 316, self time word lines "STWL1" 304, "STWL2" 306 and "STWL4" 308 will either be asserted or not asserted. The combination of self time word lines "STWL1" 304, "STWL2" 306, "STWL4" 308 and "STWL6" that are asserted will activate the desired number of core cells providing the M-factor for the amount of bit line separation desired. M-factors for combinations of self time enable line "STEN1" 312, "STEN2" 314, and "STEN4" 316 states are provided in TABLE 1.

TABLE 1

| STEN 4 | STEN 2 | STEN 1 | M-factor |
|---|---|---|---|
| 0 | 0 | 0 | 13 |
| 0 | 0 | 1 | 12 |
| 0 | 1 | 0 | 11 |
| 0 | 1 | 1 | 10 |
| 1 | 0 | 0 | 9 |
| 1 | 0 | 1 | 8 |
| 1 | 1 | 0 | 7 |
| 1 | 1 | 1 | 6 |

The self time circuit of the present invention allows for easier modification of the bit line separation through multiple methods such as a FIB (Focused Ion Beam) change, a single mask change, or through external signals. Further, the self time circuit can be built with a varying number of self time word lines/enables to allow for more or less variability of the bit line separation. In this manner, the present invention allows for experimentation with the bit line separation required for sensing which is a parameter that is impossible to determine without empirical silicon test data. Since the speed of the memory is directly related to the amount of bit line separation, therefore knowledge of the bit line separation parameter will allow faster memories to be fabricated. The ability to modify the bit line separation is also useful in failure analysis because inadequate bit line separation can be a cause of functional failure of the memory.

It is believed that the system and method of the present invention and many of their attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A self time circuit for a memory, comprising:
   a plurality of core cells within the memory;
   a plurality of self time word lines, each of the self time lines being coupled to at least one core cell for activating the core cell; and
   a plurality of self time enable lines, each self time enable line being coupled to a logic gate with a
   common self time word line, the output of the logic gate being a self time word line;
   wherein at least two of the self time word lines are coupled to a different number of the core cells for providing multiple bit line separations when the memory is accessed.

2. The self time circuit as claimed in claim 1, wherein at least one of the logic gates comprises a NOR gate.

3. The self time circuit as claimed in claim 1, wherein the self time enable lines are set to a desired state prior to the memory being accessed.

4. The self time circuit as claimed in claim 1, comprising a first self time word line coupled to a first core cell, a second self time word line coupled to a second core cell and a third core cell, and a third self time word line coupled to a fourth core cell, a fifth core cell, a sixth core cell, and a seventh core cell.

5. The self time circuit as claimed in claim 4, further comprising a first self time enable line, a second self time enable line, and a third self time enable line, the first, second and third self time enable lines being coupled to a logic gate with a common self time word line, the output of each logic gate being one of the first, second, and third self time word lines respectively.

6. The self time circuit as claimed in claim 5, wherein at least one of the logic gates comprises a NOR gate.

7. The self time circuit as claimed in claim 5, wherein the self time enable lines are set to a desired state prior to the memory being accessed.

8. A memory, comprising:
   a plurality of core cells;
   a plurality of self time word lines, each of the self time lines being coupled to at least one core cell for activating the core cell;

a plurality of self time enable lines, each self time enable line being coupled to a common self time word line by a logic gate, the output of the logic gate being a self time word line, wherein at least two of the self time word lines are coupled to a different number of the core cells for providing multiple bit line separations when the memory is accessed.

9. The memory as claimed in claim 8, wherein at least one of the logic gates comprises a NOR gate.

10. The memory as claimed in claim 8, wherein the self time enable lines are set to a desired state prior to the memory being accessed.

11. The memory as claimed in claim 8, comprising a first self time word line coupled to a first core cell, a second self time word line coupled to a second core cell and a third core cell, and a third self time word line coupled to a fourth core cell, a fifth core cell, a sixth core cell, and a seventh core cell.

12. The memory as claimed in claim 11, further comprising a first self time enable line, a second self time enable line, a third self time enable line, the first, second and third self time enable lines being coupled to a logic gate with a common self time word line, the output of each logic gate being one of the first, second, and third self time word lines respectively.

13. The memory as claimed in claim 12, wherein at least one of the logic gates comprises a NOR gate.

14. The memory as claimed in claim 12, wherein the self time enable lines are set to a desired state prior to the memory being accessed.

15. A self time circuit for a memory, comprising:

a plurality of core cells within the memory; and means, coupled to the core cells, for activating different numbers of the core cells, the activating means comprising a first self time word line coupled to a first core cell, a second self time word line coupled to a second core cell and a third core cell, and a third self time word line coupled to a fourth core cell, a fifth core cell, a sixth core cell, and a seventh core cell;

wherein activating different numbers of core cells allows multiple bit line separations to be provided when the memory is accessed.

16. The self time circuit as claimed in claim 15, wherein the activating means are set to a desired state prior to the memory being accessed.

17. The self time circuit as claimed in claim 15, wherein the activating means further comprises a first self time enable line, a second self time enable line, and a third self time enable line, the first, second and third self time enable lines being coupled to a logic gate with a common self time word line, the output of each logic gate being one of the first, second, and third self time word lines respectively.

18. The self time circuit as claimed in claim 17, wherein the activating means are set to a desired state prior to the memory being accessed.

19. A self time circuit for a memory, comprising:

a plurality of core cells within the memory; and a plurality of self time word lines, each of the self time lines being coupled to at least one core cell for activating the core cell, the plurality of self time word lines comprising a first self time word line coupled to a first core cell, a second self time word line coupled to a second core cell and a third core cell, and a third self time word line coupled to a fourth core cell, a fifth core cell, a sixth core cell, and a seventh core cell;

wherein at least two of the self time word lines are coupled to a different number of the core cells for providing multiple bit line separations when the memory is accessed.

20. The self time circuit as claimed in claim 19, further comprising a plurality of self time enable lines, each self time enable line being coupled to a logic gate with a common self time word line, the output of the logic gate being a self time word line.

21. The self time circuit as claimed in claim 20, wherein at least one of the logic gates comprises a NOR gate.

22. The self time circuit as claimed in claim 20, wherein the self time enable lines are set to a desired state prior to the memory being accessed.

23. The self time circuit as claimed in claim 19, further comprising a first self time enable line, a second self time enable line, and a third self time enable line, the first, second and third self time enable lines being coupled to a logic gate with a common self time word line, the output of each logic gate being one of the first, second, and third self time word lines respectively.

24. The self time circuit as claimed in claim 23, wherein at least one of the logic gates comprises a NOR gate.

25. The self time circuit as claimed in claim 23, wherein the self time enable lines are set to a desired state prior to the memory being accessed.

\* \* \* \* \*